(12) United States Patent
Yamada

(10) Patent No.: US 6,809,334 B2
(45) Date of Patent: Oct. 26, 2004

(54) SEMICONDUCTOR INTEGRATED CIRCUIT DEVICE, AND METHOD OF MANUFACTURING THE SAME

(75) Inventor: Keiichi Yamada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/968,032

(22) Filed: Oct. 2, 2001

(65) Prior Publication Data

US 2002/0140048 A1 Oct. 3, 2002

(30) Foreign Application Priority Data

Mar. 30, 2001 (JP) ........................................ 2001-099815

(51) Int. Cl.[7] .......................... H01L 23/48; H01L 23/52
(52) U.S. Cl. .......................... 257/59; 257/750; 257/752; 257/753; 438/624; 438/631
(58) Field of Search ................................ 257/347–354, 257/636, 637, 638, 506, 507, 524, 632, 635, 752, 760

(56) References Cited

U.S. PATENT DOCUMENTS

| | | | | |
|---|---|---|---|---|
| 5,622,887 A | * | 4/1997 | Miwa et al. ................ | 438/202 |
| 5,665,993 A | * | 9/1997 | Keller et al. ................ | 257/377 |
| 5,696,386 A | * | 12/1997 | Yamazaki .................... | 257/57 |
| 5,744,865 A | * | 4/1998 | Jeng et al. .................. | 257/750 |
| 5,945,711 A | * | 8/1999 | Takemura et al. .......... | 257/344 |
| 5,960,252 A | * | 9/1999 | Masuki et al. ................ | 438/3 |
| 6,162,723 A | * | 12/2000 | Tanaka ........................ | 438/638 |
| 6,255,160 B1 | * | 7/2001 | Huang ........................ | 438/253 |
| 6,300,659 B1 | * | 10/2001 | Zhang et al. ................ | 257/347 |
| 6,426,285 B1 | * | 7/2002 | Chen et al. ................ | 438/624 |
| 6,429,484 B1 | * | 8/2002 | Yu ............................ | 257/347 |
| 2003/0201440 A1 | * | 10/2003 | Satou et al. ................ | 257/59 |

FOREIGN PATENT DOCUMENTS

JP 2000-156481 6/2000

* cited by examiner

Primary Examiner—Jerome Jackson
Assistant Examiner—Jesse A. Fenty
(74) Attorney, Agent, or Firm—McDermott Will & Emery LLP

(57) ABSTRACT

The invention relates to a semiconductor integrated circuit and a method of manufacturing the same, and particularly, to prevention of a drop in the performance and reliability of a semiconductor integrated circuit device, which would otherwise be induced by degassing arising in a TEOS/CVD silicon oxide film provided on a back surface of a semiconductor substrate. There are proposed a semiconductor substrate in which a TEOS/CVD silicon oxide film provided on a back surface of the semiconductor substrate is coated with another dielectric film; a semiconductor substrate not having a TEOS/CVD silicon oxide film on a back surface thereof; a semiconductor substrate in which a TEOS/CVD silicon oxide film is removed from a back surface of the substrate; and a semiconductor substrate in which a thin TEOS/CVD silicon oxide film—which involves degassing falling within a tolerance is provided on a back surface of the substrate.

12 Claims, 13 Drawing Sheets

*Fig. 3*
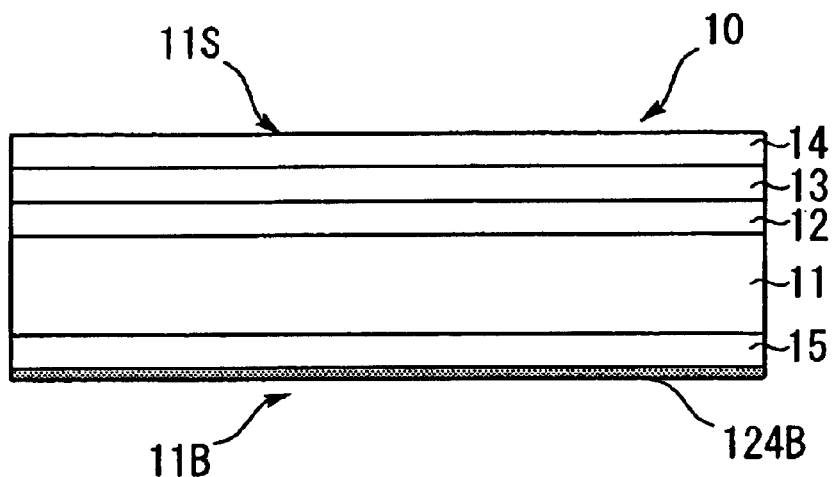
*Fig. 4A*    *Fig. 4B*
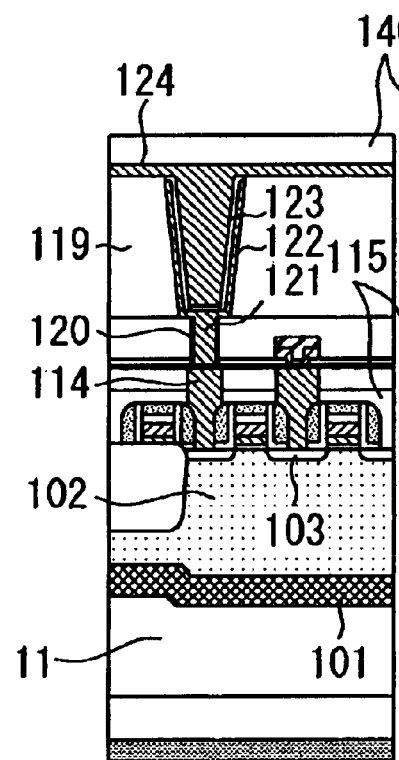
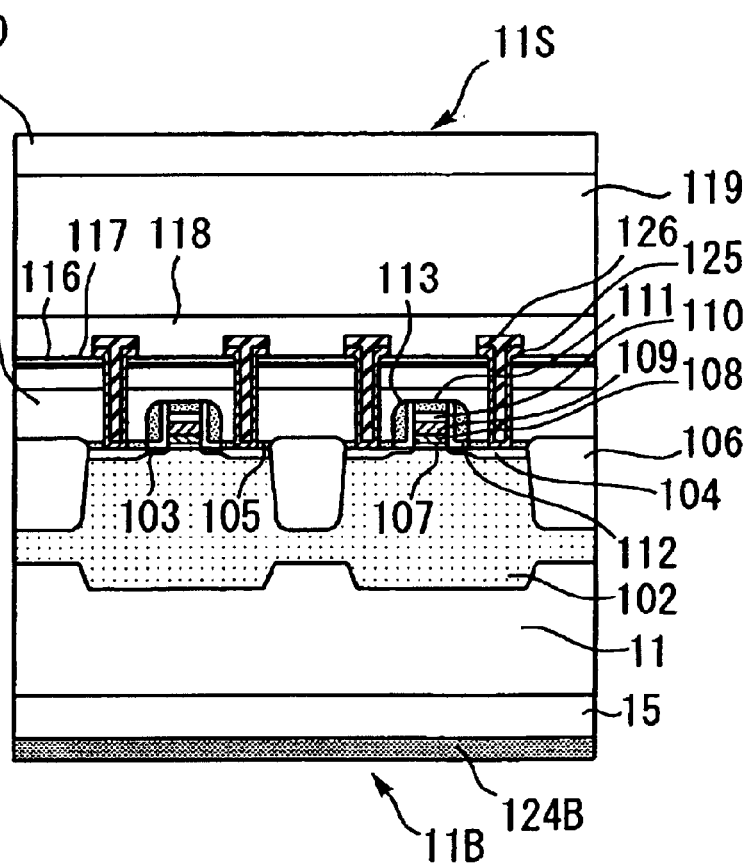

Fig. 7
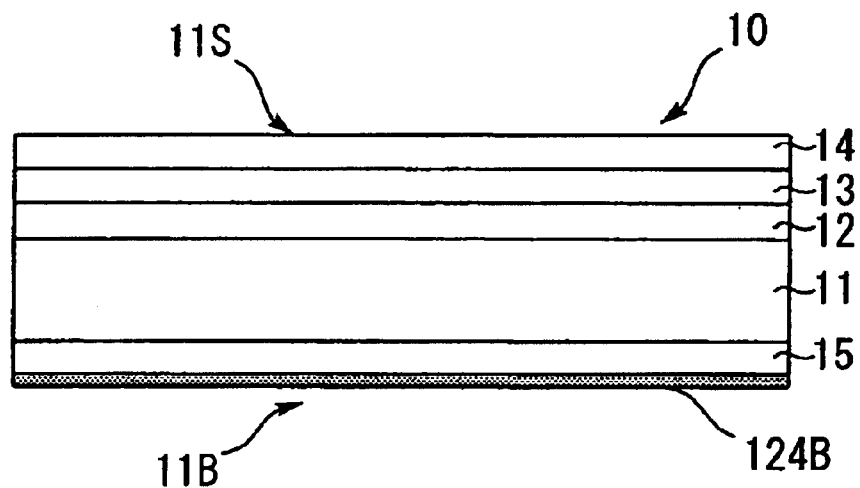
Fig. 8A    Fig. 8B
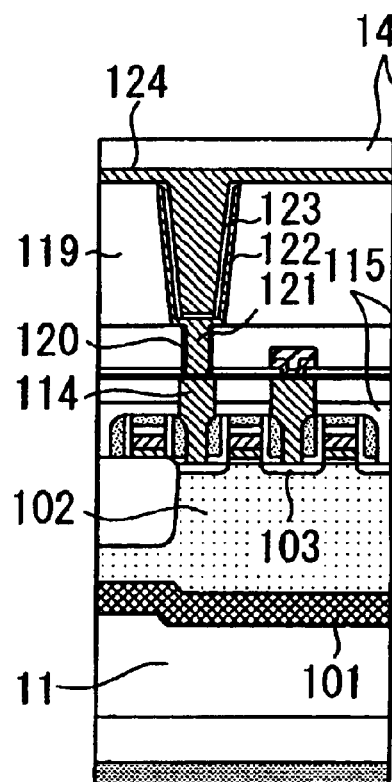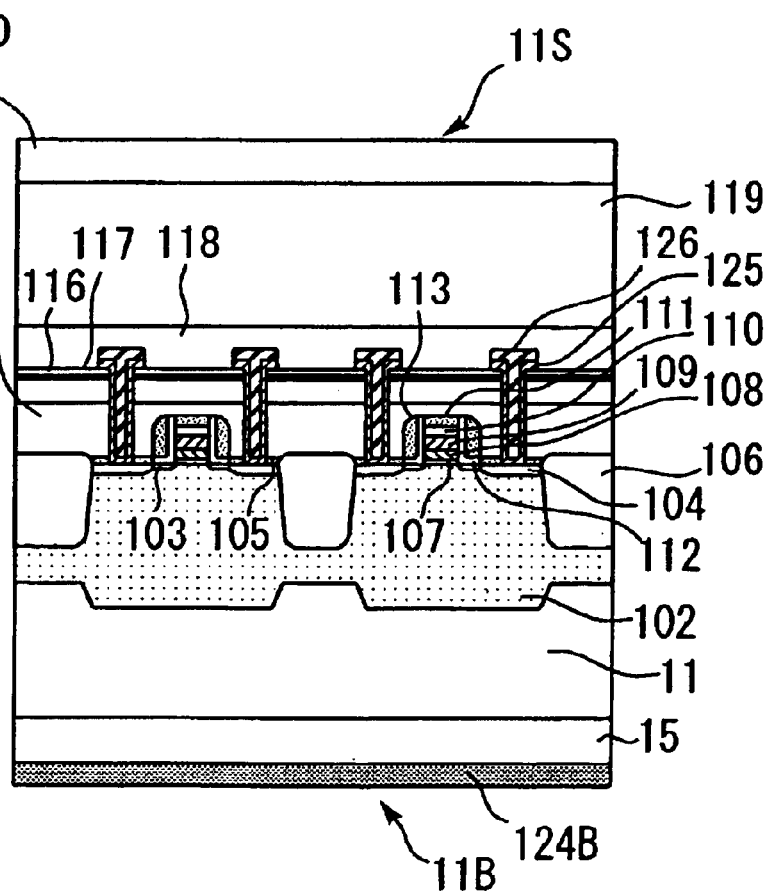

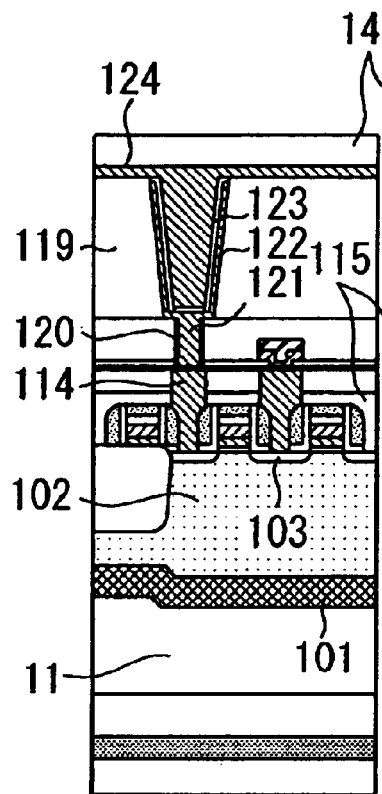
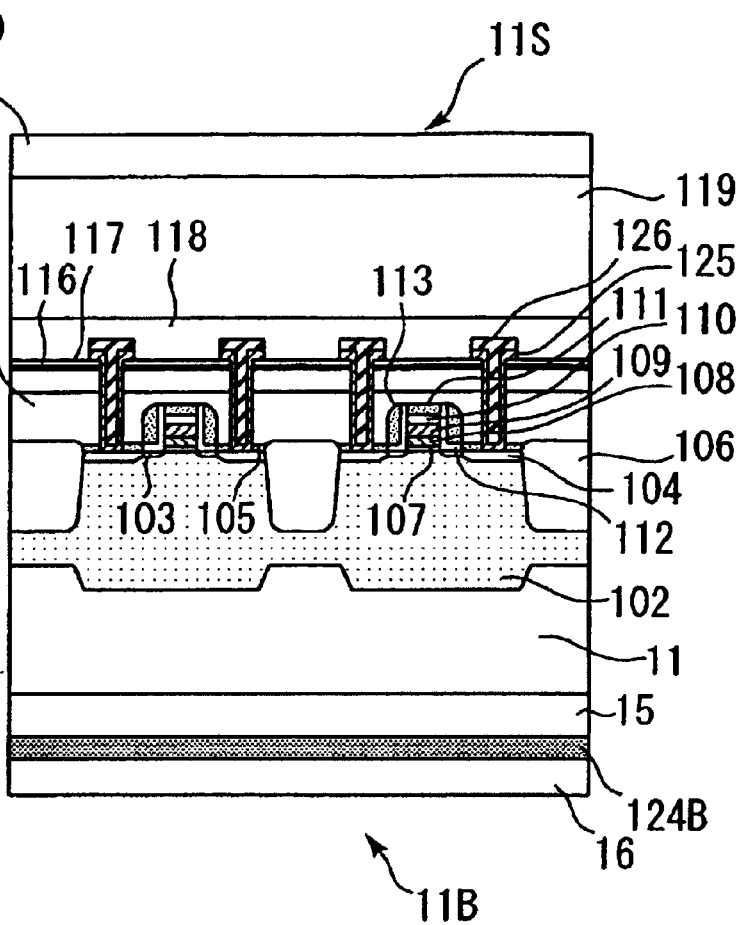
Fig. 11A  Fig. 11B
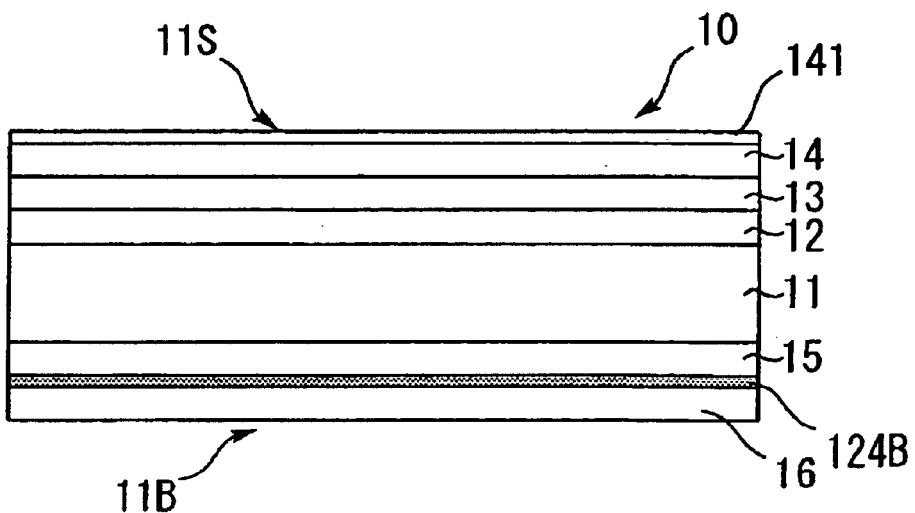
Fig. 12

SEMICONDUCTOR INTEGRATED CIRCUIT DEVICE, AND METHOD OF MANUFACTURING THE SAME

BACKGROUND OF THE INVENTION

1. Field of the Invention

The present invention relates to a semiconductor integrated circuit device, such as DRAM, and to a method of manufacturing the semiconductor integrated circuit device.

2. Background Art

A semiconductor substrate, such as silicon, is used in a semiconductor integrated circuit device. The semiconductor substrate has a top surface and a back surface, which oppose each other. The top surface of the semiconductor substrate serves as a circuit element fabrication surface on which a plurality of circuit elements, such as transistors or capacitors, are to be fabricated. In contrast, the back surface of the semiconductor substrate is die-bonded to a die pad of a lead frame.

In a semiconductor integrated circuit device, a multilayer interconnection is formed on the surface of a semiconductor substrate for interconnecting circuit elements. In relation to the multilayer interconnection, a TEOS/CVD silicon oxide film is often used as an interlayer dielectric film. The TEOS/CVD silicon oxide film is a silicon oxide film which is to be deposited on the surface of a semiconductor substrate by means of a plasma CVD technique employing TEOS (tetraethylorthosilicate).

FIG. 31 shows a related-art semiconductor integrated circuit device having a TEOS/CVD silicon oxide film. In the semiconductor integrated circuit device, a transistor layer 2 and a capacitor layer 3 are formed on a top surface 1S of the semiconductor substrate 1. Further, a multilayer interconnection layer 4 is formed on the capacitor layer 3. During a process of forming the transistor layer 2 and the capacitor layer 3 on the top surface 1S, a multilayer film 5 is formed on a back surface 1B of the semiconductor substrate 1. During a process of forming a TEOS/CVD silicon oxide film on the top surface 1S as an interlayer dielectric film of the multilayer interconnection layer 4, same TEOS/CVD silicon oxide film 6 is formed.

During a process of forming a multilayer interconnection on the surface of the semiconductor substrate 1, the TEOS/CVD silicon oxide film 6 on the back surface 1B of the semiconductor substrate 1 still remains as an exposed back surface of the semiconductor substrate 1. The TEOS/CVD silicon oxide film has the property of being apt to contain or absorb moisture and to produce a gas primarily consisting of moisture upon exposure to a temperature rise. During a process of forming the multilayer interconnection layer 4, the TEOS/CVD silicon oxide film formed on the top surface 1S of the semiconductor substrate 1 is coated with an aluminum film, silane other than a TEOS gas, and a silicon oxide film which is formed through plasma CVD through use of oxygen, which make degassing difficult. Hence, a degassing problem does not arise. In contrast, the TEOS/CVD silicon oxide film 6 on the back surface 1B of the semiconductor substrate 1 remains exposed during the process of forming a multilayer interconnection. Degassing arises as a result of a temperature rise induced by a process of evaporating aluminum on the TEOS/CVD silicon dielectric film on the top surface 1S, by a process of forming an interlayer film between aluminum layers, or by a process of subjecting an aluminum film to plasma etching. Degassing induces a drop in vacuum or abnormal electric discharge during a vacuum process (such as an aluminum deposition process), a process of forming an interlayer film, and a process of plasma etching of aluminum.

The present invention relates to a semiconductor integrated circuit device and a method of manufacturing the semiconductor integrated circuit device, which obviate occurrence of the foregoing problems.

SUMMARY OF THE INVENTION

According to one aspect of the present invention, a semiconductor integrated circuit device comprises: a semiconductor substrate having a top surface and a back surface, which oppose each other; a plurality of circuit elements fabricated on the top surface of the semiconductor substrate along with a TEOS/CVD silicon oxide film; another TEOS/CVD silicon oxide film formed on the back surface of the semiconductor substrate; and a dielectric film, other than the TEOS/CVD silicon oxide film, that does not cause much degassing and that covers the TEOS/CVD silicon oxide film provided on the back surface of the semiconductor substrate.

According to another aspect of the present invention, a semiconductor integrated circuit device comprises: a semiconductor substrate having a top surface and a back surface, which oppose each other; and a plurality of circuit elements fabricated on the top surface of the semiconductor substrate along with a TEOS/CVD silicon oxide film, the TEOS/CVD silicon oxide film not being formed on the back surface of the semiconductor substrate.

According to another aspect of the present invention, a semiconductor integrated circuit device comprises: a semiconductor substrate having a top surface and a back surface, which oppose each other; a plurality of circuit elements fabricated on a top surface of the semiconductor substrate along with a TEOS/CVD silicon oxide film; and a TEOS/CVD silicon oxide film which is formed on the back surface of the semiconductor substrate and involves degassing falling within a tolerance employed in a process of forming a semiconductor integrated circuit device on the semiconductor substrate.

Other features and advantages of the invention will be apparent from the following description taken in connection with the accompanying drawings.

BRIEF DESCRIPTION OF THE DRAWINGS

FIG. 3 is a schematic cross-sectional view showing a semiconductor integrated circuit device according to a second embodiment of the present invention.

FIGS. 4(A) and 4(B) are cross-sectional views showing details of the semiconductor integrated circuit device according to the second embodiment of the present invention.

FIGS. 7, 8(A) and 8(B) show a second step of the processes for manufacturing the semiconductor integrated circuit according to the second embodiment.

FIGS. 9 through 14 show a semiconductor integrated circuit device as configured in the manufacturing processes according to the third embodiment.

DETAILED DESCRIPTION OF THE PREFERRED EMBODIMENTS

First Embodiment

Figure 1:
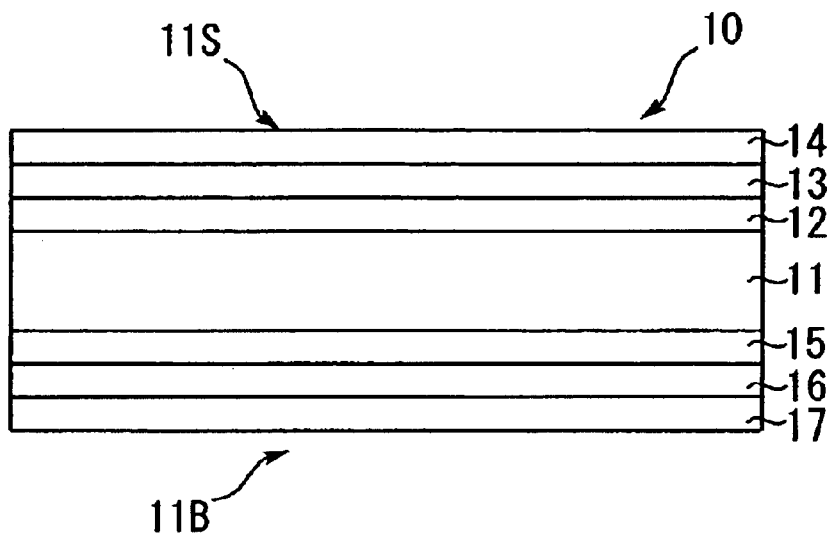
FIG. 1 is a schematic cross-sectional view showing a semiconductor integrated circuit according to a first embodiment of the present invention.

FIG. 1 is a schematic cross-sectional view showing a semiconductor integrated circuit according to a first embodiment of the present invention. A semiconductor integrated circuit device 10 shown in FIG. 1 is one separated from a plurality of semiconductor integrated circuit devices fabricated in a semiconductor wafer. The device 10 is DRAM called, e.g., eRAM. The device 10 has a top surface 11S on which are to be fabricated a plurality of circuit elements, and a back surface 11B opposing the top surface 11S. The top surface 11S serves as a circuit element fabrication surface on which a plurality of circuit elements, such as MOS transistors and capacitors, are to be fabricated. The device 10 has a semiconductor substrate 11, such as a silicon substrate. The semiconductor substrate 11 is diced from a silicon wafer. In a process of manufacturing a wafer, a manufacturing process proceeds while the semiconductor substrate 11 having the plurality of devices 10 fabricated thereon is included in a silicon wafer. The top surface 11S of the semiconductor substrate 11 serves as a circuit element fabrication surface. The circuit element fabrication surface 11S includes a transistor layer 12 formed on the surface of the semiconductor substrate 11, a capacitor layer 13 formed on the transistor layer 12, and a multilayer interconnection layer 14 formed on the capacitor layer 13. The back surface 11B of the semiconductor substrate 11 is coated with a stacked film 15. The stacked film 15 is formed during the process of forming the transistor layer 12 and the capacitor 13 on the circuit element fabrication surface 11S. The stacked film 15 is coated with the TEOS/CVD silicon oxide film 16. During the course of a process of forming the multilayer interconnection layer 14 on the circuit element fabrication surface 11S, the TEOS/CVD silicon oxide film 16 is formed also on the back surface 11B through a process of forming a TEOS/CVD silicon oxide film as an interlayer dielectric film. The TEOS/CVD silicon oxide film 16 is coated with an amorphous silicon film 17.

In a process immediately after the process of forming the TEOS/CVD silicon oxide film 16 also on the back surface 11B of the device 10 through a process of forming a TEOS/CVD silicon oxide film on the circuit element fabrication surface 11S as an interlayer dielectric film, the amorphous silicon film 17 is formed so as to cover the TEOS/CVD silicon oxide film 16. The amorphous silicon film 17 is formed only on the back surface 11B of the device 10 and not on the circuit element fabrication surface 11S of the device 10.

A TEOS/CVD silicon oxide film is usually apt to contain and absorb moisture and to produce a gas primarily consisting of moisture when exposed to a temperature rise. After a TEOS/CVD silicon oxide film has been formed on the circuit element fabrication surface 11S of the device 10 as an interlayer dielectric film, an aluminum interconnection is formed on the circuit element fabrication surface 11S. Thus, the circuit element fabrication surface 11S is heated. However, the circuit element fabrication surface 11S is coated with an aluminum film or a plasma oxide film, which film is less likely to cause degassing. Hence, a degassing problem does not arise. The TEOS/CVD silicon oxide film 16—which is formed on the back surface 11B and has the potential of posing a problem—is coated with the amorphous silicon film 17 during the multilayer interconnection process. Accordingly, there is prevented occurrence of degassing in the TEOS/CVD silicon oxide film 16.

Even in a completed semiconductor integrated circuit device, the amorphous silicon film 17 is left as the outermost layer on the back surface 11B. Consequently, even in the case of the completed semiconductor integrated circuit device, occurrence of degassing in the TEOS/CVD silicon oxide film 16 can be prevented.

Figure 2A:
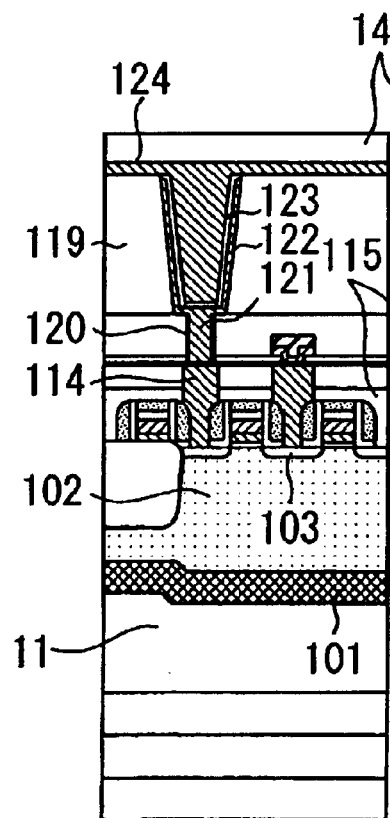
FIGS. 2(A) and 2(B) are cross-sectional views more specifically showing the structure of the semiconductor integrated circuit according to the first embodiment.
Figure 2B:
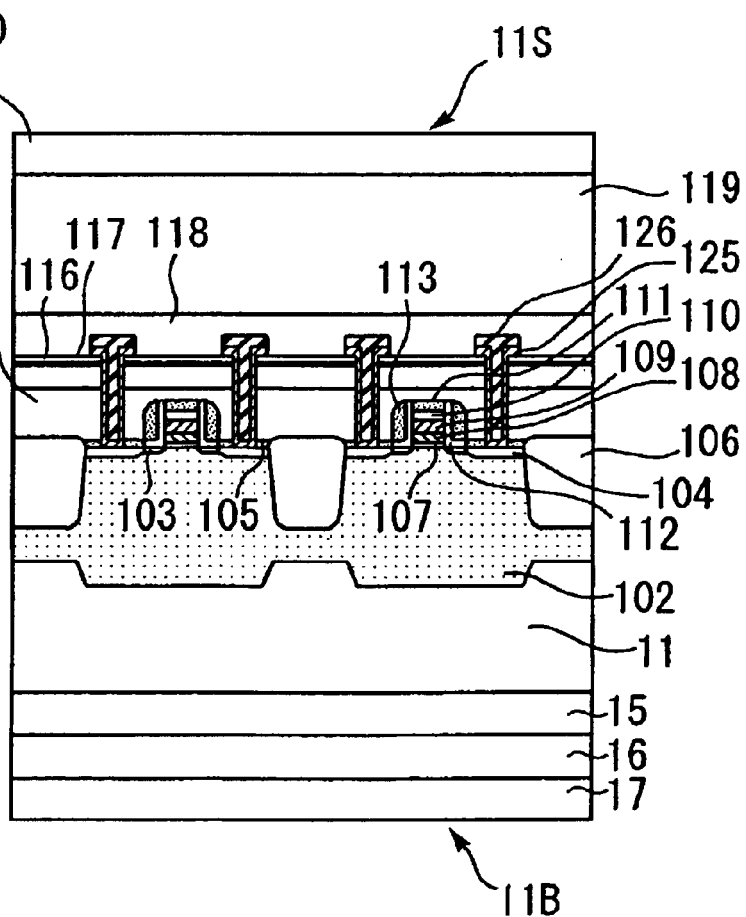

FIGS. 2(A) and 2(B) are cross-sectional views more specifically showing the structure of the semiconductor integrated circuit according to the first embodiment; particularly, the state of eRAM in an interconnection process. FIG. 2(A) shows a memory element section, and FIG. 2(B) is a cross-sectional view showing a logic circuit section.

The eRAM device 10 has a semiconductor substrate 11 formed from p-type silicon. In a memory element section shown in FIG. 2(A), a bottom n-well 101 is formed on the top surface 11S of the semiconductor substrate 11, and a p-well 102 is formed on the n-well 101. A plurality of n-channel transistors 103 of LDD structure are fabricated on the surface of the p-well 102. The transistors 103 are covered with a BPSG film 115. Formed on the BPSG film 115 are a silicon nitride film 116, a silicon oxide film 117, and a silicon oxide film 118. Phosphor-doped polysilicon 114 is formed so as to penetrate through the BPSG film 115, and a lower portion of the polysilicon 114 is connected to the drains of the transistors 103.

Phosphor-doped polysilicon 121 is formed on top of the polysilicon 114. A lower portion of the polysilicon 121 is connected to an upper edge of the polysilicon 114 by means of penetrating through the silicon nitride film 116 and the silicon oxide films 117 and 118. The surroundings of the polysilicon 121 are covered with the silicon nitride film 120. A thick silicon oxide film 119 is formed on the silicon oxide film 118. A phosphor-doped polysilicon film 122 is cylindrically formed in a through hole which penetrates through the thick silicon oxide film 119. A lower portion of the polysilicon film 122 is connected to the polysilicon 121, thus constituting one of two electrodes of a capacitor. A phosphor-doped polysilicon film 124 is formed in the polysilicon film 122 by way of a gate nitride film 123. The polysilicon film 124 constitutes a cell plate serving as the remaining electrode of the capacitor.

In the logic circuit section shown in FIG. 2(B), the p-well 102 is formed on the top surface 11S of the semiconductor substrate 11. A plurality of n-channel MOS transistors 103 of LDD structure are formed on the surface of the p-well 102. Each of the transistors 103 includes an $n^+$-type high concentration source/drain region 104. A cobalt silicate ($CoSi_2$) 105 is formed on the source/drain region 104. An isolation dielectric film 106 is formed between the p-wells 102, thus separating the p-wells 102 from each other. The gate of each of the transistors 103 comprises a phosphor-doped polysilicon gate electrode 108, tungsten silicide 109, a silicon oxide film 110, and a silicon nitride film 111, which are formed in this sequence on a gate dielectric film 107. Either side of the gate is coated with a silicon oxide film 112 and a silicon nitride film 113.

The transistors 103 located in the logic circuit section are covered with the BPSG film 115. The BPSG film 115 is further coated with a silicon nitride film 116 and a silicon oxide film 117. Contact holes are formed in the BPSG film 115, the silicon nitride film 116, and the silicon oxide film 117 so as to extend to the source/drain regions 104 of the respective transistors 103. A titanium nitride/titanium layer 125 and tungsten 126 are provided in each of the contact holes, thus constituting a lead electrode of each of the source/drain regions 104.

The lead electrode formed from the titanium nitride/titanium layer 125 and the tungsten 126 is coated with the silicon oxide film 118. The silicon oxide film 118 is covered with a thick silicon oxide film 119.

As shown in FIGS. 2(A) and 2(B), a thick silicon oxide film 119 is formed on the top surface 11S of the semiconductor substrate 11. During the course of a process of forming a cell plate 124 on the silicon oxide film 119, the stacked film 15 is formed on the back surface 11B of the semiconductor substrate 11. A TEOS/CVD silicon oxide film 140 which is to act as an interlayer dielectric film of the multilayer interconnection layer 14 is formed on the cell plate 124 of the memory element section shown in FIG. 2(A) and on the thick silicon oxide film 119 of the logic circuit section shown in FIG. 2(B). The TEOS/CVD silicon oxide film 140 is formed from a TEOS (tetraethylorthosilicate) gas by means of the plasma CVD technique. Simultaneously, the TEOS/CVD silicon oxide film 16 is formed on the back surface 11B of the stacked film 15 of the semiconductor substrate 11.

In the first embodiment, the amorphous silicon film 17 is formed so as to cover the TEOS/CVD silicon oxide film 16 provided on the back surface 11B of the semiconductor substrate 11. The amorphous silicon film 17 is formed in a process immediately after formation of the TEOS/CVD silicon films 140 and 16, and on only the back surface 11B; not on the top surface 11S of the semiconductor substrate 11. An aluminum film for multilayer interconnection is evaporated on the TEOS/CVD silicon oxide film 140 and is patterned by means of plasma etching. Before evaporation of the aluminum film, the amorphous silicon film 17 is formed on the back surface 11B. The amorphous silicon film 17 provided on the back surface 11B prevents occurrence of degassing in the TEOS/CVD silicon oxide film 16, which would otherwise arise as a result of a temperature rise induced by a process of evaporating an aluminum film on the top surface 11S, by a process of subjecting the aluminum film to plasma etching, and by processes subsequent to the plasma etching process.

The amorphous silicon film 17 has the property of being unlikely to cause degassing. In addition to the amorphous silicon film, a polysilicon film, a silicon nitride film, and a CVD silicon oxide film formed from a mixed gas consisting of silane and oxygen have the property of being unlikely to cause degassing. The same advantage is yielded, even when any one of these dielectric films is employed in lieu of the amorphous silicon film 17.

The amorphous silicon film 17 or an alternative polysilicon film, a silicon nitride film, or a CVD silicon oxide film formed from a mixed gas consisting of silane and oxygen may be formed on the top surface 11S of the semiconductor substrate 11. In such a case, the film is removed from the top surface 11S so as to remain on only the back surface 11B.

Second Embodiment

FIG. 3 is a schematic cross-sectional view showing a semiconductor integrated circuit device according to a second embodiment of the present invention. In the second embodiment, a polysilicon film 124B is formed on the back surface 11B of the semiconductor substrate 11, so as to cover the stacked film 15. However, the TEOS/CVD silicon oxide film 16 is not formed on the back surface 11B. In the completed semiconductor integrated circuit device 10, the polysilicon film 124B constitutes the outermost film of the back surface 11S.

FIGS. 4(A) and 4(B) are cross-sectional views showing details of the semiconductor integrated circuit device according to the second embodiment of the present invention. As shown in FIGS. 4(A) and 4(B), only the TEOS/CVD silicon oxide film 140 serving as an interlayer dielectric film is illustrated as the multilayer interconnection layer 14. FIG. 4(A) shows a memory section substantially identical with that shown in FIG. 2(A), and FIG. 4(B) shows a logic circuit section substantially identical with that shown in FIG. 2(B). In FIGS. 4(A) and 4(B), elements identical with those shown in FIGS. 2(A) and 2(B) are assigned the same reference numerals. The polysilicon film 124B is exposed on the back surface 11B of the semiconductor substrate 11.

In the second embodiment, the TEOS/CVD silicon oxide film 16 is not formed on the back surface 11B of the semiconductor substrate 11. The multilayer interconnection layer 14 is formed while the TEOS/CVD silicon oxide film 16 is not present on the back surface 11B; that is, while the polysilicon film 124B is present as the outermost layer on the back surface 11B. Consequently, even in a step of forming a multilayer interconnection on the top surface 11S of the semiconductor substrate 11 (hereinafter often called a "multilayer interconnection step"), no degassing arises in the back surface 11B, thus preventing occurrence of a failure due to degassing.

In the process of forming the polysilicon film 124 constituting a cell plate on the top surface 11S of the semiconductor substrate 11, the polysilicon film 124B is formed on the back surface 11B. Even when exposed to a temperature rise stemming from the process of forming a multilayer interconnection on the top surface 11S, the polysilicon film 124B does not cause degassing.

Figure 5:
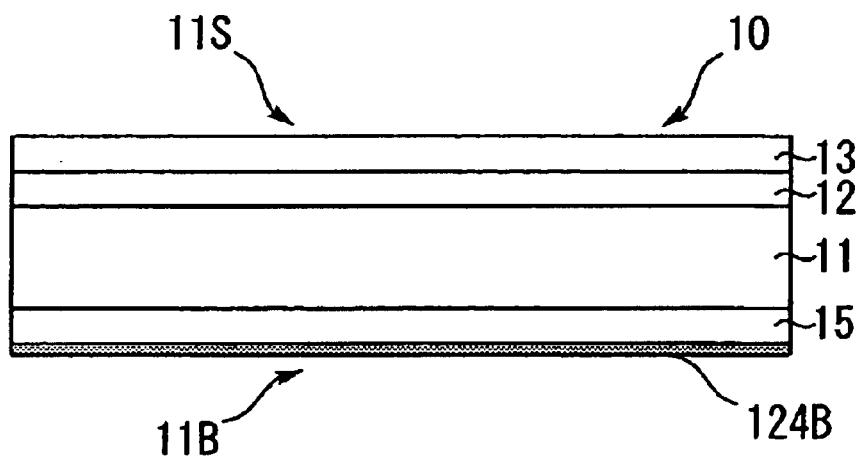
FIGS. 5, 6(A), and 6(B) show a semiconductor integrated circuit device as configured in a first step of the manufacturing processes according to the second embodiment.
Figure 6A:
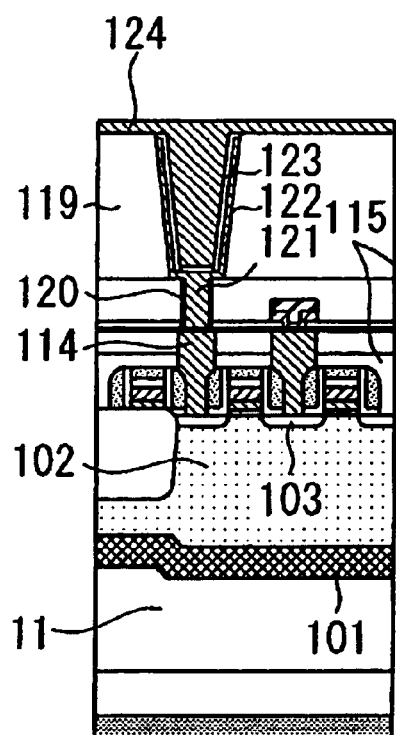
Figure 6B:
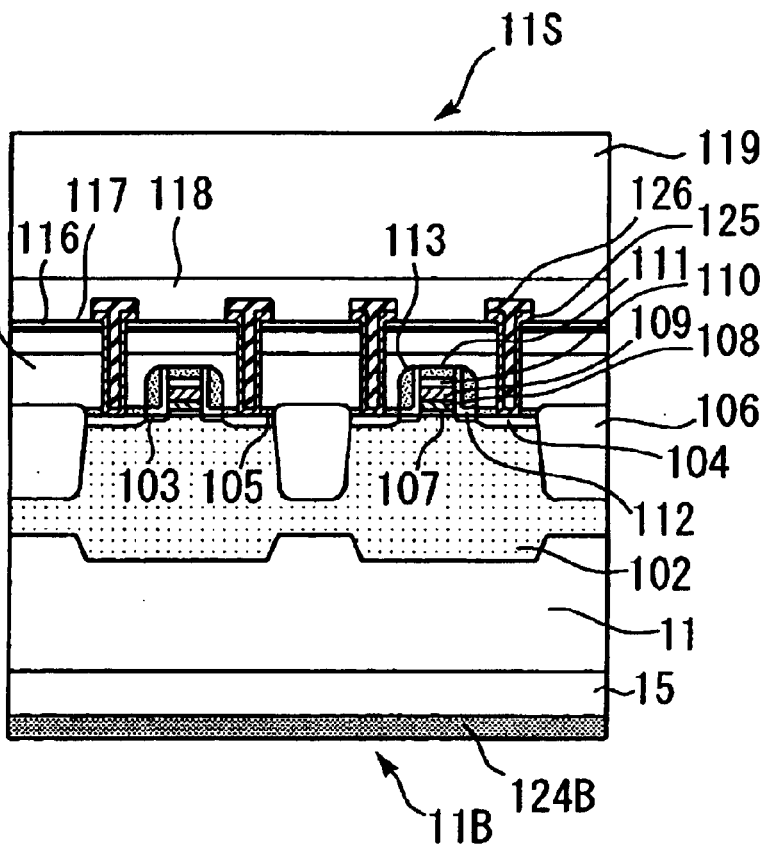

FIGS. 5, 6(A), and 6(B) show a semiconductor integrated circuit device as configured in a first step of the manufacturing processes according to the second embodiment. The first step is a final stage of the processes of manufacturing the capacitor layer 13. In this stage, the polysilicon film 124 constituting a cell plate is formed on the top surface 11S of the semiconductor substrate 11. FIG. 5 is a schematic cross-sectional view of the semiconductor substrate 11 in the process. FIGS. 6(A) and 6(B) are cross-sectional views showing details of the semiconductor substrate 11. FIG. 6(A) shows a memory element section substantially identical with that shown in FIG. 4(A), and FIG. 6(B) shows a logic circuit section substantially identical with that shown in FIG. 4(B). Throughout the drawings, elements which are identical with those shown in FIGS. 3, 4(A) and 4(B) are assigned the same reference numerals.

In the first step shown in FIGS. 5, 6(A), and 6(B), a transistor layer 12 and a capacitor layer 13 are formed on the top surface 11S of the semiconductor substrate 11, in the sequence given. More specifically, as shown in FIGS. 6(A) and 6(B), the first step is a stage in which the polysilicon film 124 constituting the cell plate is formed. The polysilicon film 124B is formed on the back surface 11B of the semiconductor substrate 11 so as to cover the stacked film 15, simultaneously with formation of the polysilicon film 124.

FIGS. 7, 8(A) and 8(B) show a second step of the processes for manufacturing the semiconductor integrated circuit according to the second embodiment. The second step is a first stage of the processes of manufacturing the multilayer interconnection layer 14. In this stage, the TEOS/CVD silicon oxide film 140 is formed on the polysilicon film 124 laid on the top surface 11S of the semiconductor substrate 11. FIG. 7 is a schematic cross-sectional view of the semiconductor substrate 11. FIGS. 8(A) and 8(B) are cross-sectional views showing details of the semiconductor substrate 11. FIG. 8(A) shows a memory element section substantially identical with those shown in FIGS. 4(A) and 6(A), and FIG. 8(B) shows a logic circuit section substantially identical with those shown in FIGS. 4(B) and 6(B). Throughout the drawings, elements which are identical with those shown in FIGS. 3 through FIGS. 6(A) and 6(B) are assigned the same reference numerals.

In the second step shown in FIGS. 7, 8(A), and 8(B), the TEOS/CVD silicon oxide film 140 is formed on the top surface 11S of the semiconductor substrate 11 so as to cover the polysilicon film 124 constituting a cell plate, as shown in FIGS. 8(A) and 8(B). However, the TEOS/CVD silicon oxide film 16 is not formed on the back surface 11B. More specifically, a single wafer processing plasma CVD system is employed for forming the TEOS/CVD silicon oxide film 140, wherein the back surface 11B of a wafer, which wafer is to formed into the semiconductor substrate 11, is brought into intimate contact with a stage, and the TEOS/CVD silicon oxide film 140 is formed on only the top surface 11S of the semiconductor substrate 11. Consequently, the TEOS/CVD silicon oxide film 16 is not formed on the back surface 11B. In steps subsequent to the second step, a step of forming a multilayer interconnection on the top surface 11S is carried out while the polysilicon film 124B is formed on the back surface 11B as the outermost film. A temperature rise is effected in the process of forming a multilayer interconnection; However, no degassing arises in the back surface 11B.

Third Embodiment

A semiconductor integrated circuit device according to a third embodiment of the present invention is identical in construction with that shown in FIGS. 3, 4(A), and 4(B). The polysilicon film 124B is exposed on the back surface 11B of the semiconductor substrate 11 as the outermost film. In the third embodiment, simultaneously with formation of the TEOS/CVD silicon oxide film 140 on the top surface S of the semiconductor substrate 11, the TEOS/CVD silicon oxide film 16 is formed also on the back surface 11B. The TEOS/CVD silicon oxide film 16 is completely removed from the back surface 11B. In a process of forming the multilayer interconnection layer 14 on the basis of the TEOS/CVD silicon oxide film 140 on the top surface 11S, the polysilicon film 124B on the back surface 11B becomes the outermost film. Hence, degassing is prevented.

Figure 9:
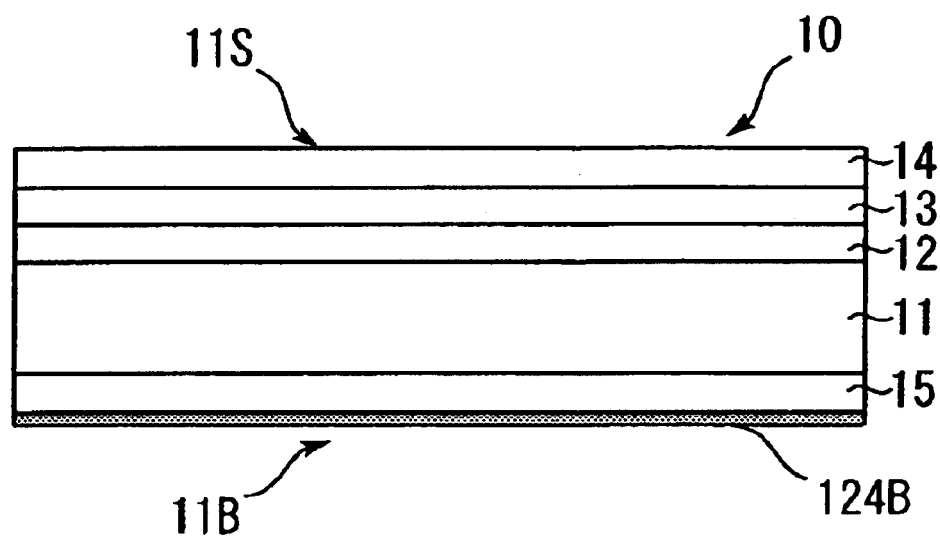
Figure 10:
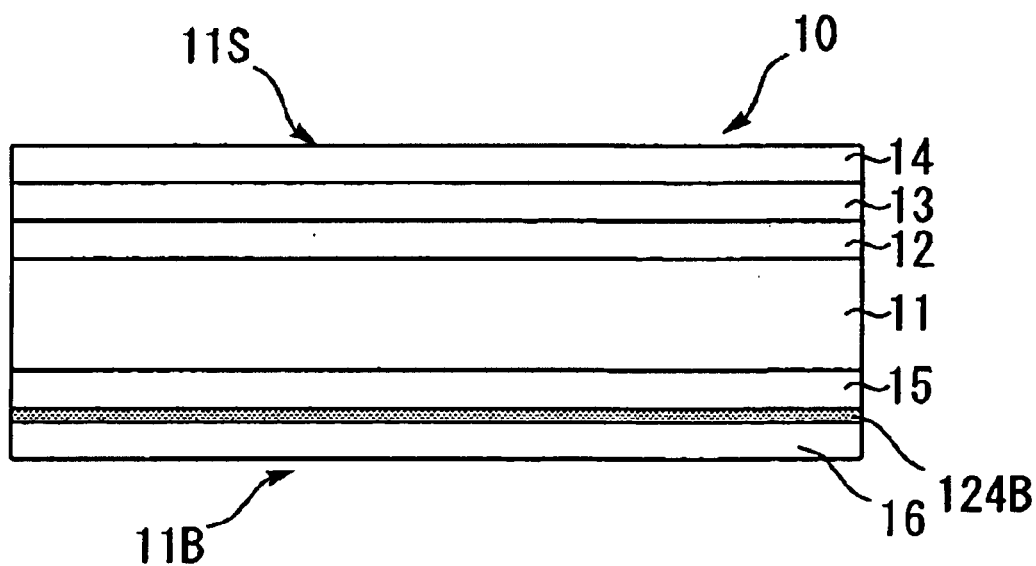

FIGS. 9 through 14 show a semiconductor integrated circuit device as configured in the manufacturing processes according to the third embodiment. FIG. 9 shows a first step in the manufacturing processes. As in the case of FIG. 5, FIG. 9 shows formation of the polysilicon film 124 constituting a cell plate. FIGS. 10 and 11 show a second step in the manufacturing processes. The second step corresponds to a stage in which the TEOS/CVD silicon oxide film 140 has been formed on the top surface 11S. FIG. 10 is a schematic cross-sectional view of the semiconductor integrated circuit device, and FIGS. 11(A) and 11(B) are detailed cross-sectional views of the same. FIG. 11(A) shows a memory element section substantially identical with those shown in FIGS. 4(A), 6(A), and 8(A). FIG. 11(B) shows a logic circuit section substantially identical with those shown in FIGS. 4(B), 6(B), and 8(B). Elements which are identical with those shown in these drawings are assigned the same reference numerals.

In the second step shown in FIGS. 10, 11(A), and 11(B), the TEOS/CVD silicon oxide film 140—which is to become a base for the multilayer interconnection layer 14—is formed on the surface of the semiconductor substrate 11. Similarly, the TEOS/CVD silicon oxide film 16 is formed on the back surface 11B. The TEOS/CVD silicon oxide films 140 and 16 are formed to a thickness of 500 nanometers at a temperature of 680 (C through use of, e.g., a TEOS gas, by means of the hot-wall CVD technique.

Figure 13:
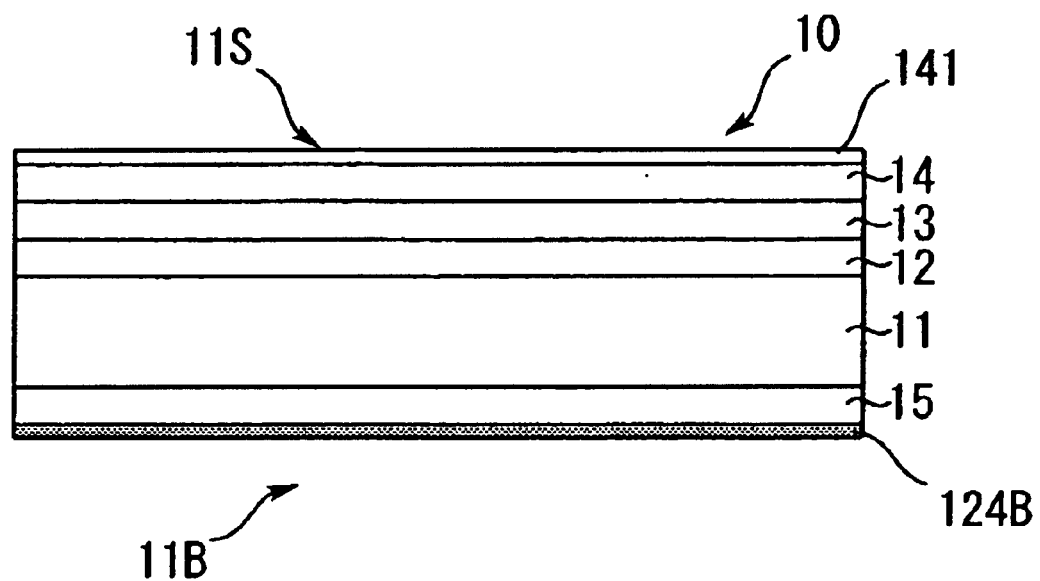

FIG. 12 shows a third step of the manufacturing processes according to the third embodiment. In the third step, a resist film 141 is applied over the top surface 11S of the semiconductor substrate 11 so as to cover the TEOS/CVD silicon oxide film 140. In this state, as shown in FIG. 13, the TEOS/CVD silicon oxide film 16 is completely removed from the back surface 11B of the semiconductor substrate 11 through use of, e.g., a BHF etchant, whereby the polysilicon film 124B is exposed. As a matter of course, the TEOS/CVD silicon oxide film 140 provided on the top surface 11S is protected by the resist film 14 and hence remains unremoved.

Figure 14:
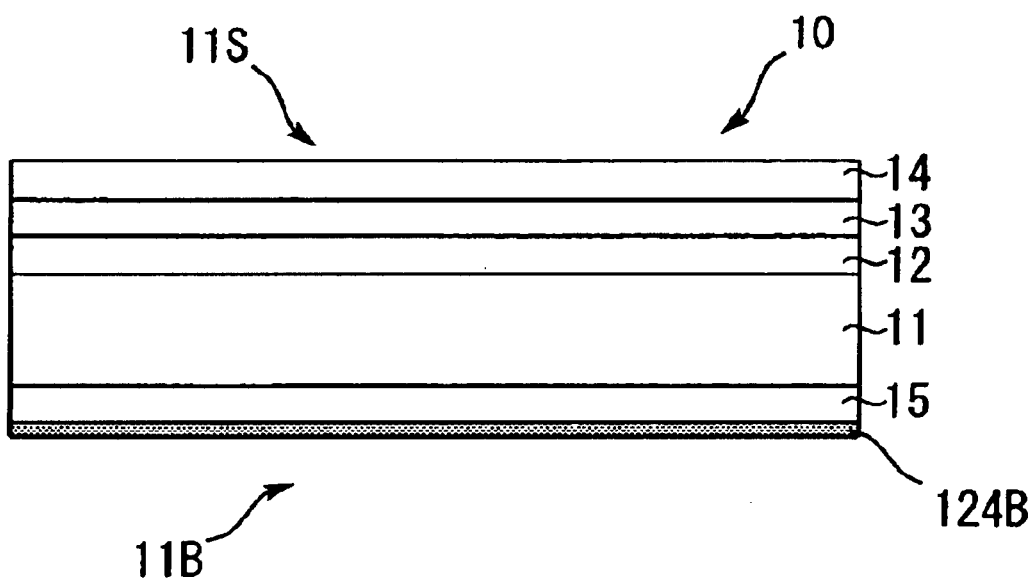

FIG. 14 shows a fifth step of the manufacturing processes according to the third embodiment. In the fifth step, the resist film 141 is removed from the top surface 11S. There is performed an operation for forming the multilayer interconnection layer 14 on the top surface 11S while the TEOS/CVD silicon oxide film 140 is taken as a base. In the step of forming the multilayer interconnection layer 14, the polysilicon film 124B is exposed on the back surface 11B as the outermost layer, thus preventing degassing.

Fourth Embodiment

Figure 15:
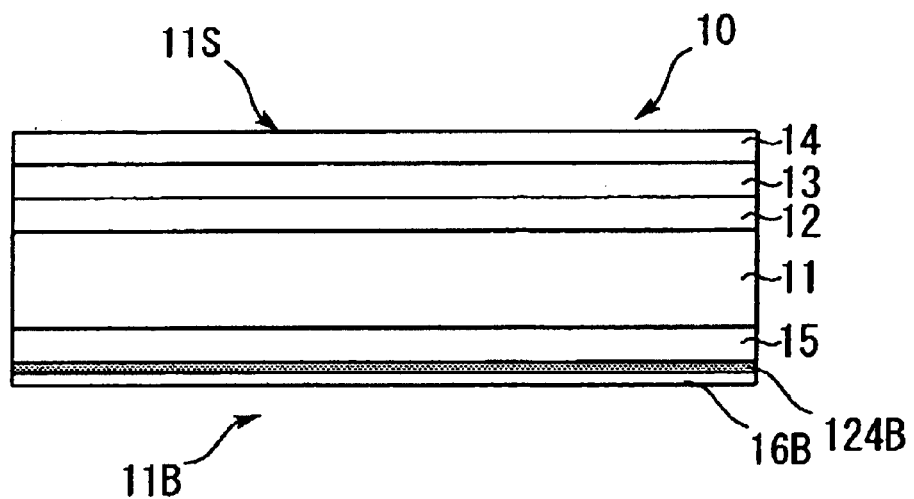
FIG. 15 is a schematic cross-sectional view showing a semiconductor integrated circuit according to a fourth embodiment of the present invention.
Figure 16A:
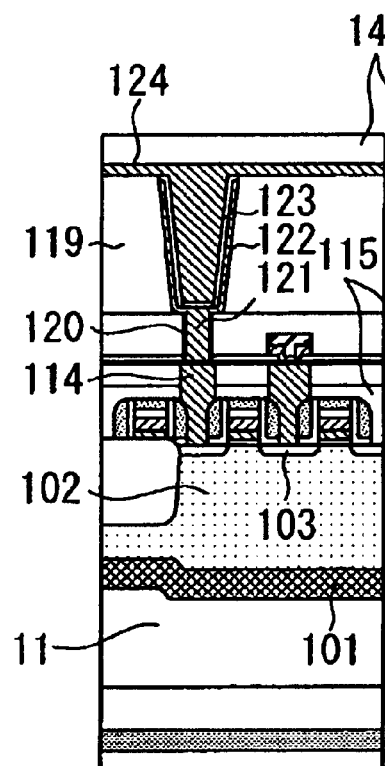
FIGS. 16(A) and 16(B) are cross-sectional views more specifically showing the structure of the semiconductor integrated circuit according to the fourth embodiment.
Figure 16B:
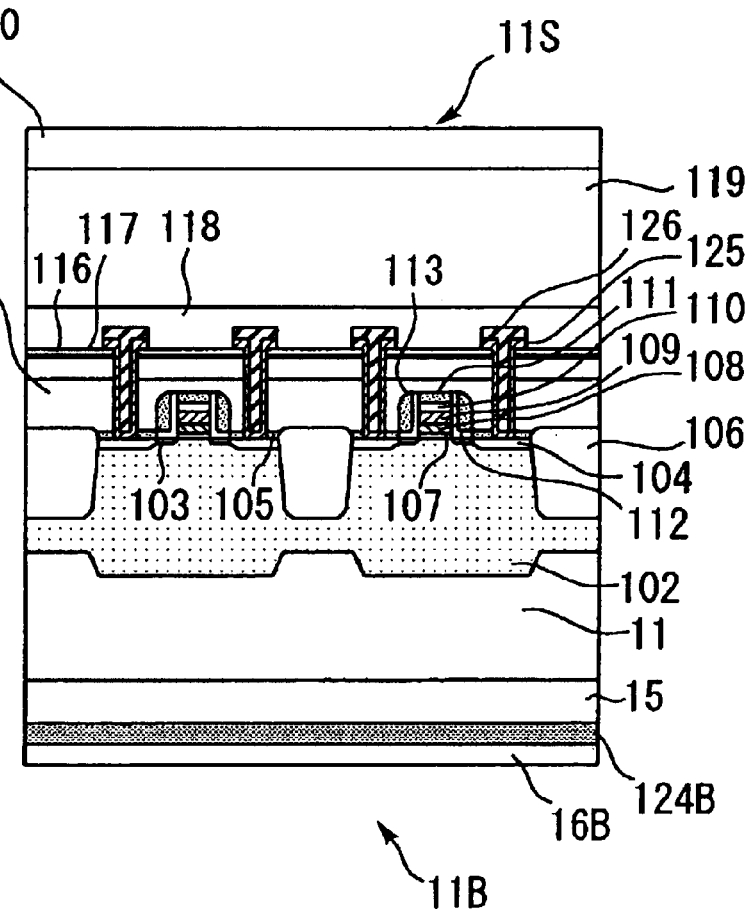

In the fourth embodiment, a thin TEOS/CVD silicon oxide film 16B which does not cause much degassing is left also on the back surface 11B of the semiconductor substrate 11. FIG. 15 is a schematic cross-sectional view of the semiconductor substrate 11 as configured in the process. FIGS. 16(A) and 16(B) are cross-sectional views showing details of the semiconductor substrate 11. FIG. 16(A) shows a memory element section substantially identical with those shown in FIGS. 4(A), 6(A), and 8(A), and FIG. 16(B) shows a logic circuit section substantially identical with those shown in FIGS. 4(B), 6(B), and 8(B). Throughout the drawings, elements which are identical with those shown in FIGS. 15, 16(A) and 16(B) are assigned the same reference numerals.

In the fourth embodiment, a polysilicon film 124B is formed on the back surface 11B of the semiconductor substrate 11 so as to cover the stacked film 15. The thin TEOS/CVD silicon oxide film 16B is formed so as to cover the polysilicon film 124B. The polysilicon film 124B is formed simultaneously with formation, on the top surface 11S, of the polysilicon film 124 constituting a cell plate. Once having been formed to the same thickness as that of the TEOS/CVD silicon oxide film 140 on the top surface 11S simultaneously with formation of the TEOS/CVD silicon oxide film 140, the TEOS/CVD silicon oxide film 16B is etched to a smaller thickness.

When the TEOS/CVD silicon oxide film 16 is completely removed from the back surface 11B of the semiconductor substrate 11 because of process restrictions, the fourth embodiment is effective. The thin TEOS/CVD silicon oxide film 16 can suppress the extent of degassing to and within a certain tolerance. According to test results, the thin TEOS/CVD silicon oxide film 16B must be set to a value of 200 nanometers or less. More specifically, the thickness of the TEOS/CVD silicon oxide film 16B is set to a value of, e.g., 50 nanometers.

Figure 17:
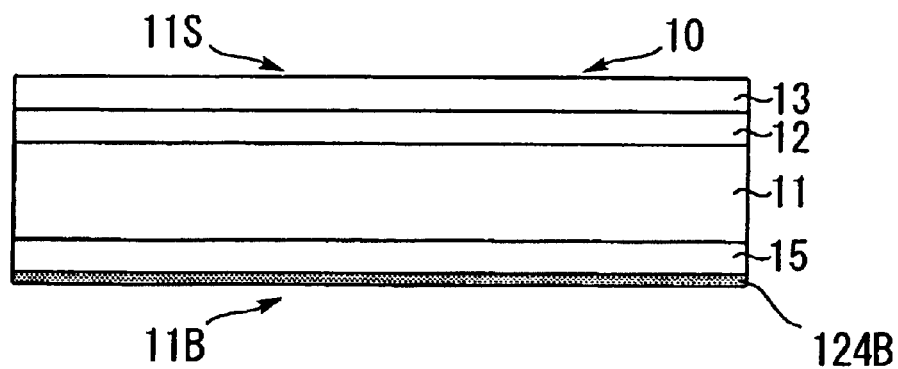
FIGS. 17 through 21 show processes of manufacturing a semiconductor integrated circuit device according to the fourth embodiment.

FIGS. 17 through 21 show processes of manufacturing the semiconductor integrated circuit device according to the fourth embodiment. As shown in FIG. 17, in a first step, the transistor layer 12 and the capacitor layer 13 are formed on the top surface 11S of the semiconductor substrate 11, and the stacked film 15 and the polysilicon film 124B are formed on the back surface 11B. The polysilicon film 124B is formed simultaneously with formation, on the top surface 11S, of the polysilicon film 124 constituting a cell plate. In the second step shown in FIG. 18, during a process for forming the TEOS/CVD silicon oxide film 140 as an interlayer dielectric film of the multilayer interconnection layer 14 on the top surface 11S, the TEOS/CVD silicon oxide film 16 is formed on the back surface 11B to the same thickness as that of the TEOS/CVD silicon oxide film 140. More specifically, the TEOS/CVD silicon oxide films 140 and 16 are formed to a thickness of 500 nanometers at a temperature of 680 (C by means of the hot-wall CVD method using a TEOS gas.

Figure 19:
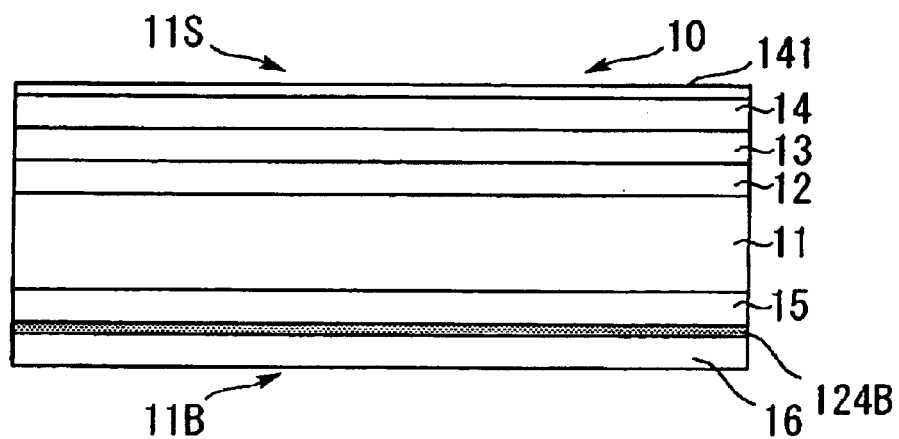
Figure 20:
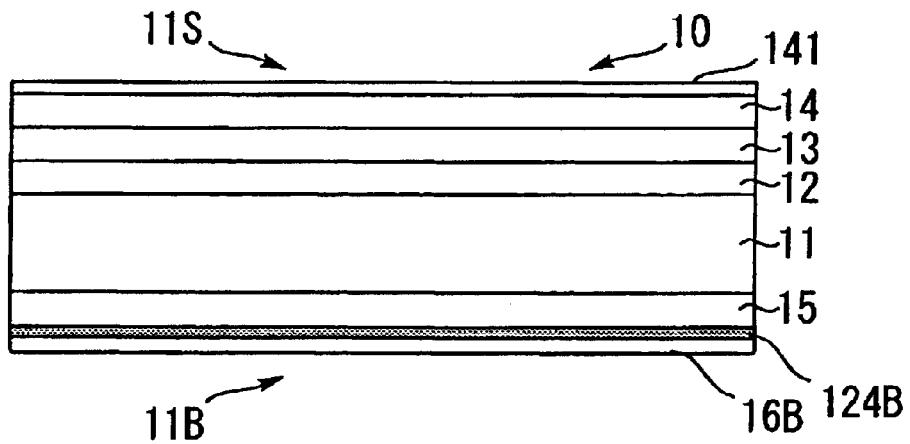
Figure 21:
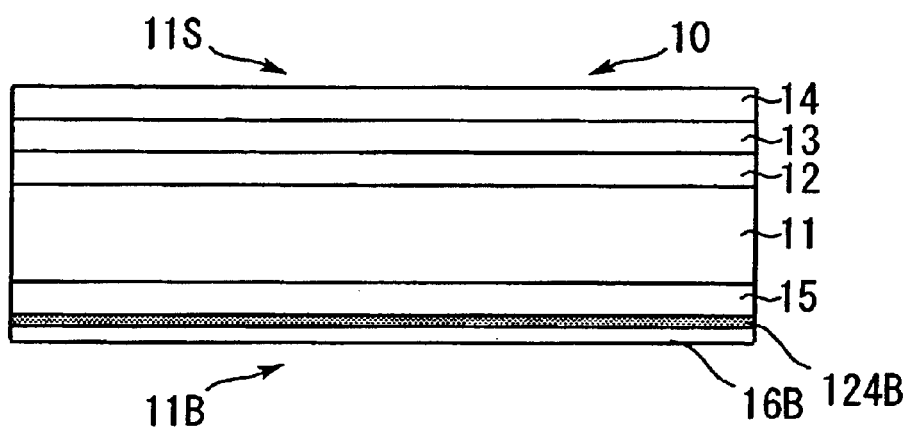

In a third step shown in FIG. 19, the TEOS/CVD silicon oxide film 140 provided on the top surface 11S is coated with the resist film 141. In this state, the TEOS/CVD silicon oxide film 16 provided on the back surface 11B is etched with a BHF etchant. As shown in FIG. 20, the TEOS/CVD silicon oxide film 16B is eventually obtained. Subsequently, no oxide film is newly deposited on the back surface 11B. In a sixth step shown in FIG. 21, the resist film 141 is removed while the thin TEOS/CVD silicon oxide film 16B is taken as the outermost layer, thereby forming the multilayer interconnection layer 14.

Fifth Embodiment

A semiconductor integrated circuit device according to a fifth embodiment of the present invention is identical with that shown in FIGS. 15 through 16(B) in connection with the fourth embodiment. The fifth embodiment differs from the fourth embodiment in processes of manufacturing the semiconductor integrated circuit device. FIGS. 22 through 27 show manufacturing processes according to the fifth embodiment.

Figure 18:
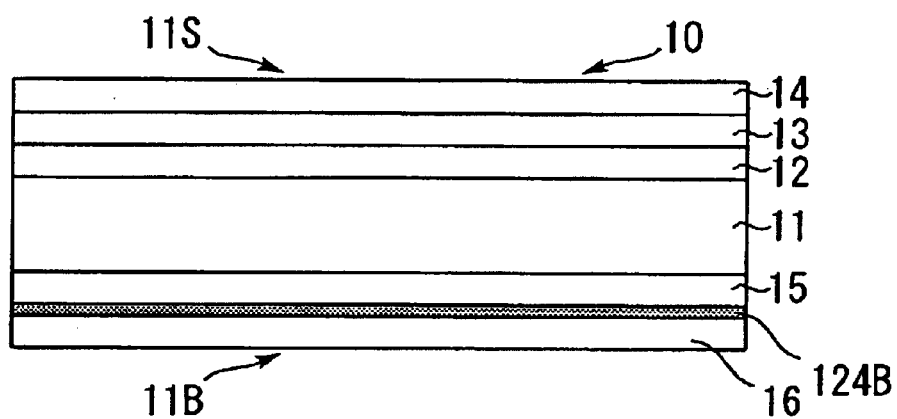
Figure 22:
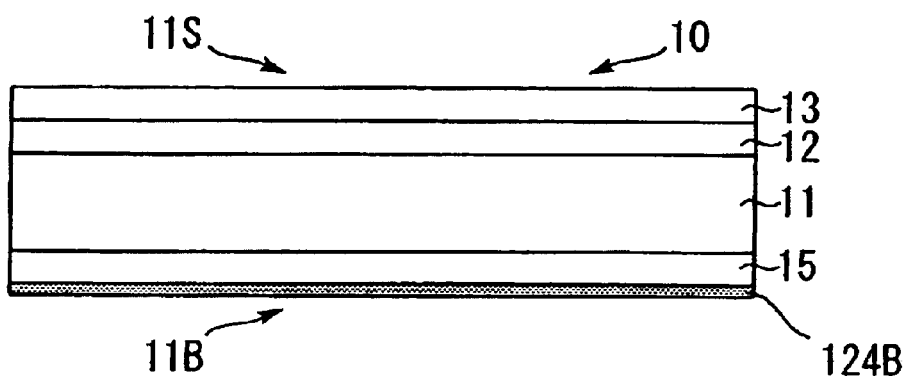
FIGS. 22 through 27 show processes of manufacturing a semiconductor integrated circuit device according to the fifth embodiment.
Figure 23:
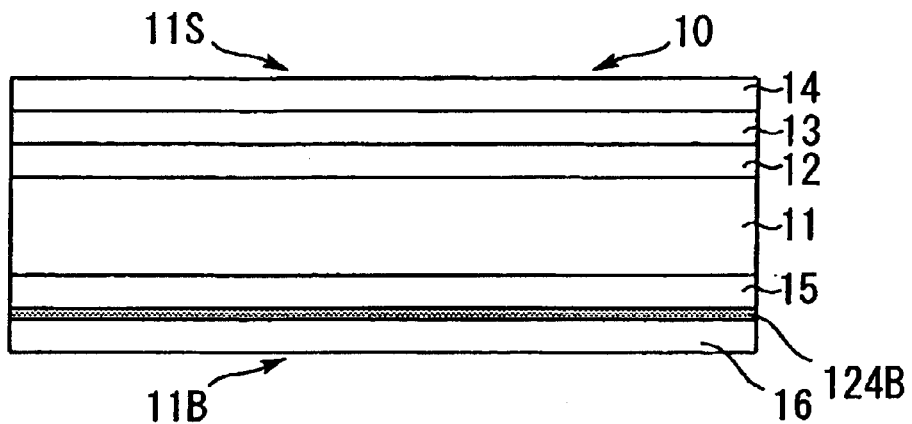
Figure 24:
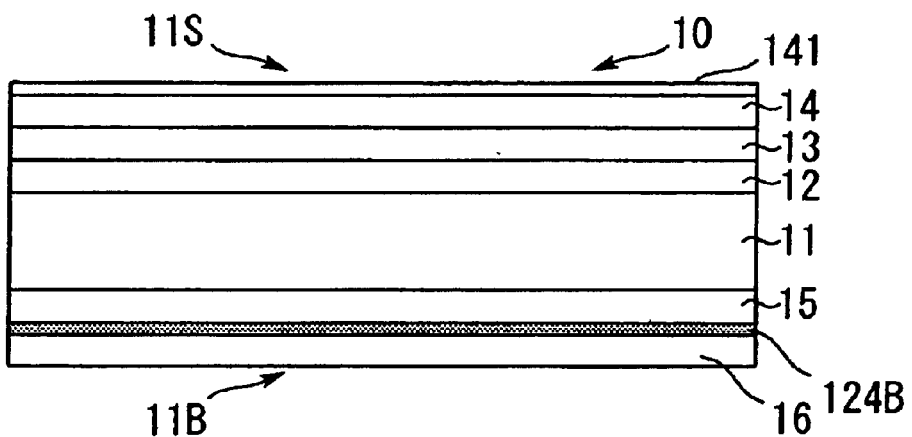
Figure 25:
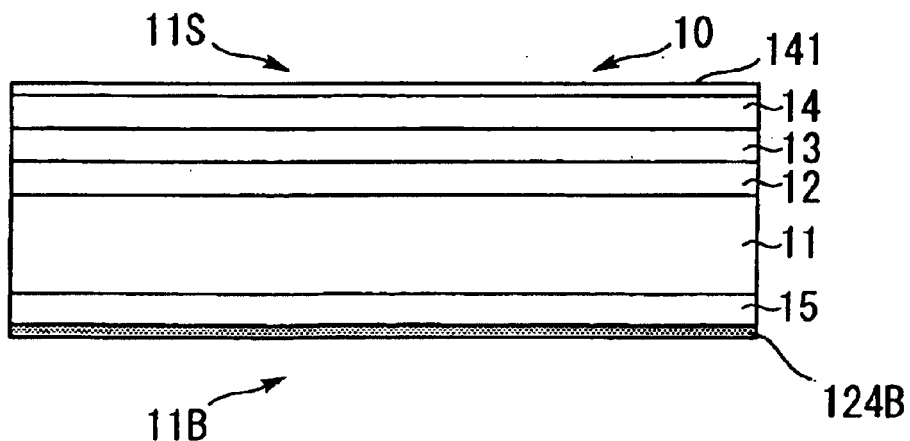
Figure 26:
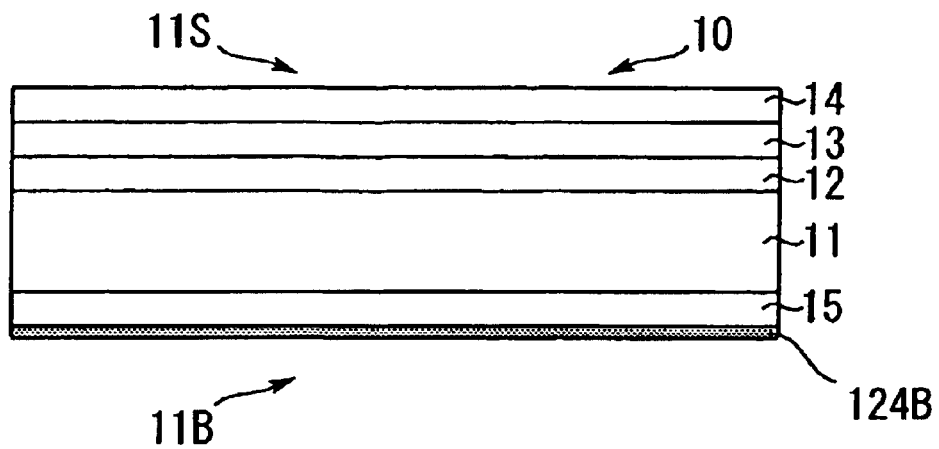
Figure 27:
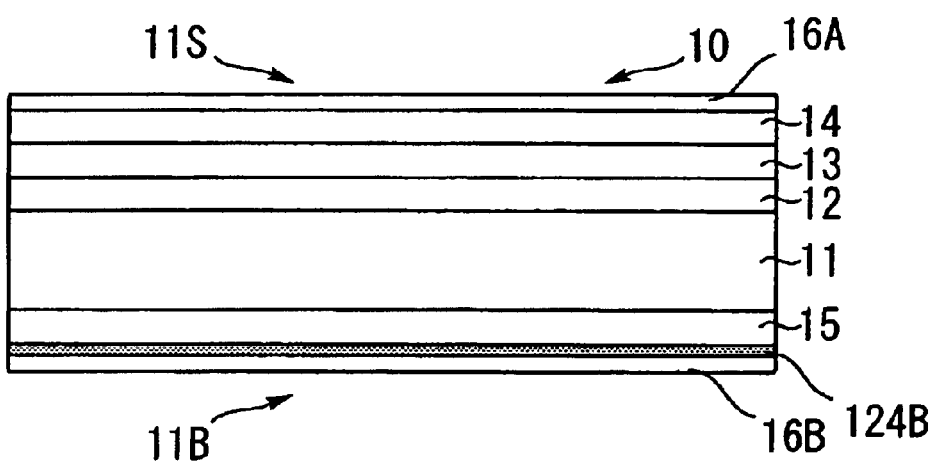

A first step shown in FIG. 22, a second step shown in FIG. 23, and a third step shown in FIG. 24 are identical with the first step shown in FIG. 17, the second step shown in FIG. 18, and the third step shown in FIG. 19, which correspond to the manufacturing processes according to the fourth embodiment. In the fourth step shown in FIG. 25, the TEOS/CVD silicon oxide film 16 is completely removed from the back surface 11B while the TEOS/CVD silicon oxide film 140 provided on the top surface 11S is covered with the resist film 141. In a fifth step shown in FIG. 26, the resist film 141 is removed. In a sixth step shown in FIG. 27, a thin TEOS/CVD silicon oxide film 16A is newly formed on the top surface 11S, and the thin TEOS/CVD silicon oxide film is formed on the back surface 11B.

These thin TEOS/CVD silicon oxide films 16A and 16B are formed to a thickness of 200 nanometers or less; e.g., to a thickness of 50 nanometers or less, by means of the CVD technique using a TEOS gas. The thin TEOS/CVD silicon oxide films 16A and 16B still remain. The TEOS/CVD silicon oxide film 16A provided on the top surface 11S is used as an interlayer dielectric film along with the TEOS/CVD silicon oxide film 140 laid underneath the TEOS/CVD silicon oxide film 16A. Further, the TEOS/CVD silicon oxide film 16B remains as the outermost layer of the back surface 11B even after the multilayer interconnection process or after completion of a product.

Sixth Embodiment

Figure 28:
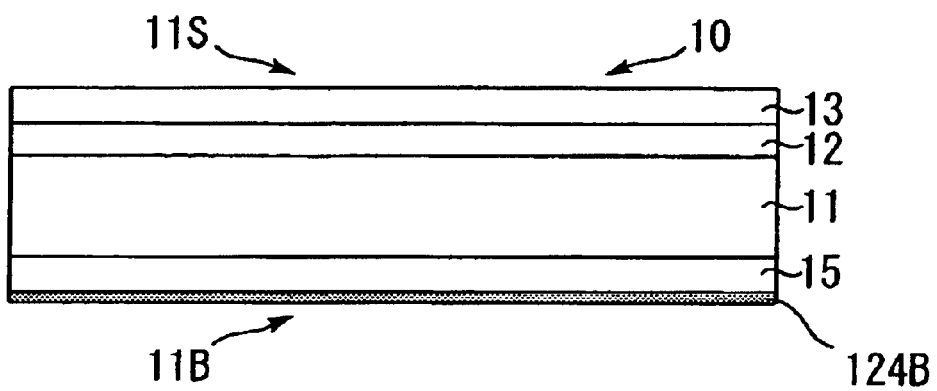
FIGS. 28 through 30 show processes of manufacturing a semiconductor integrated circuit device according to the sixth embodiment.
Figure 29:
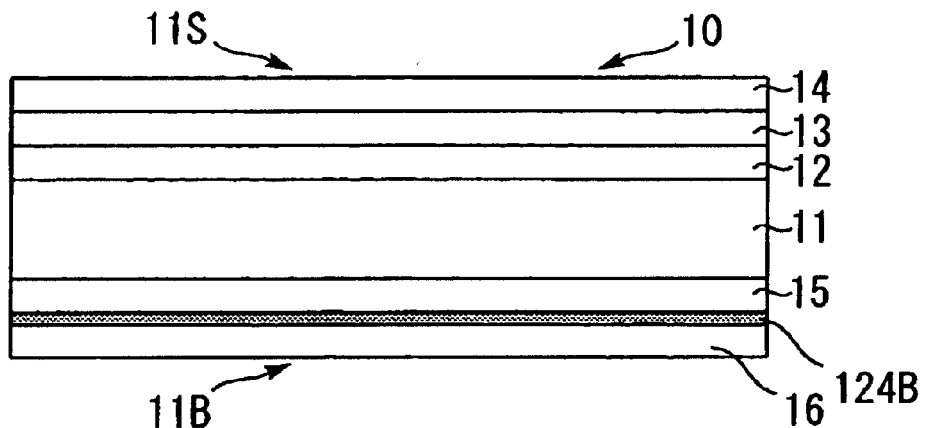
Figure 30:
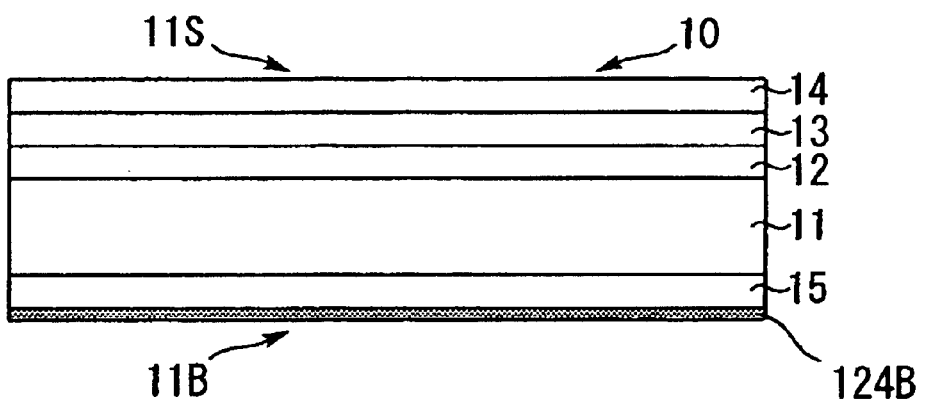
Figure 31:
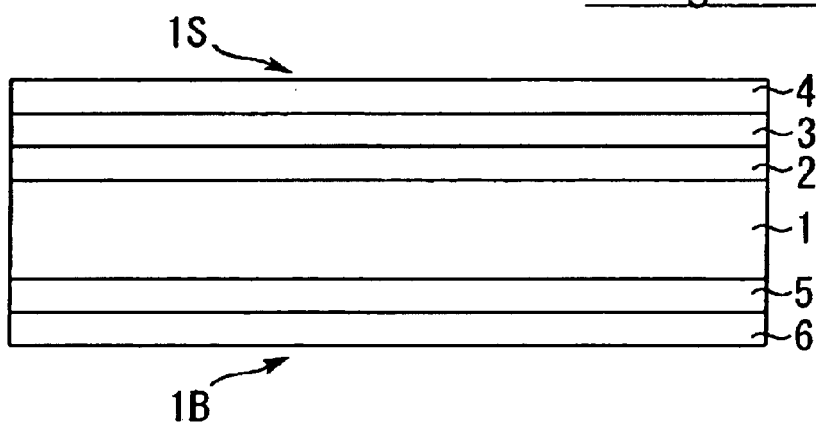
FIG. 31 shows a related-art semiconductor integrated circuit device having a TEOS/CVD silicon oxide film.

A semiconductor integrated circuit device according to a sixth embodiment of the present invention is identical in configuration with those shown in FIGS. 3, 4(A), and 4(B). Manufacturing processes are analogous to those shown in FIGS. 9 through 14 in connection with the third embodiment. Manufacturing processes according to the sixth embodiment are shown in FIGS. 28 through 30. A first step shown in FIG. 28 is identical with the first step of the manufacturing processes according to the third embodiment shown in FIG. 9. A second step shown in FIG. 29 is identical with the second step of the manufacturing processes according to the third embodiment shown in FIG. 10.

The manufacturing method according to the sixth embodiment is characterized in subjecting the semiconductor integrated circuit device shown in FIG. 29 to dry etching, thereby removing only the TEOS/CVD silicon oxide film 16 from the back surface 11B. As a result, the TEOS/CVD silicon oxide film 140 is left in its present form on the top surface 11S. Therefore, in a dry etching process, the top surface 11S is held in close contact with a stage while the semiconductor substrate 11 is held as a wafer. As shown in FIG. 30, only the TEOS/CVD silicon oxide film 16 is removed from the back surface 11B. In this manufacturing process, the TEOS/CVD silicon oxide film 16 can be readily removed without involvement of application of the resist film 141 shown in FIGS. 12 and 13.

The features and the advantages of the present invention may be summarized as follows.

As has been described, in a semiconductor integrated circuit device according to the present invention, a TEOS oxide film formed on the back surface of a semiconductor substrate is covered with a dielectric film, other than a TEOS/CVD silicon oxide film, that does not cause much degassing. To this end, the TEOS/CVD silicon oxide film provided on the back surface is covered with an amorphous silicon film or a polysilicon film, thereby preventing occurrence of degassing in the TEOS/CVD silicon dielectric film provided on the back surface. As a result, there can be prevented a drop in the degree of vacuum in manufacturing processes as well as a drop in the performance and reliability of a semiconductor integrated circuit device.

In the semiconductor integrated circuit device according to the present invention, a TEOS/CVD silicon oxide film is not formed on the back surface of a semiconductor substrate. There can be prevented occurrence of degassing in a TEOS/CVD silicon dielectric film provided on the back surface, a drop in the degree of vacuum in manufacturing processes, and a drop in the performance and reliability of a semiconductor integrated circuit device.

In the semiconductor integrated circuit device according to the present invention, a thin TEOS oxide film which involves degassing falling within a given tolerance is formed on the back surface of the semiconductor substrate.

Alternatively, a thin TEOS/CVD silicon oxide film having a thickness of 200 nanometers or less is formed on the back surface of the semiconductor substrate. While process restrictions, which would otherwise be induced by complete removal of a TEOS oxide film on the back surface, are avoided, the degree of degassing developing in the TEOS/CVD silicon dielectric film provided on the back surface is suppressed so as to fall within a tolerance. Thus, there can be prevented a drop in the degree of vacuum in manufacturing processes, as well as a drop in the performance and reliability of a semiconductor integrated circuit device.

The present invention also provides various methods of manufacturing a semiconductor integrated circuit device as described above. The features of the method inventions may be summarized as follows.

According to one aspect of the present invention, provided is a method of manufacturing a semiconductor integrated circuit device, comprising: a first step of fabricating a plurality of circuit elements on a top surface of a semiconductor substrate which has a top surface and a back surface, which oppose each other; a second step of forming a TEOS/CVD silicon oxide film on the top and back surfaces of the semiconductor substrate; and a third step of forming a dielectric film, other than the TEOS/CVD silicon oxide film, that does not cause much degassing and that covers the TEOS/CVD silicon oxide film provided on the back surface of the semiconductor substrate.

In another aspect of the present invention, in the above method of manufacturing a semiconductor integrated circuit device, an amorphous silicon film is formed in the third step so as to cover the TEOS/CVD silicon oxide film provided on the back surface of the semiconductor substrate.

In another aspect of the present invention, in the above method of manufacturing a semiconductor integrated circuit, a polysilicon film is formed in the third step so as to cover the TEOS/CVD silicon oxide film provided on the back surface of the semiconductor substrate.

According to another aspect of the present invention, provided is a method of manufacturing a semiconductor integrated circuit device, comprising: a first step of fabricating a plurality of circuit elements on a top surface o a semiconductor substrate which has a top surface and a back surface, which oppose each other; and a second step of forming a TEOS/CVD silicon oxide film on the top surface such that the TEOS/CVD silicon oxide film is not formed on the back surface of the semiconductor substrate.

According to another aspect of the present invention, provided is a method of manufacturing a semiconductor integrated circuit device, comprising: a first step of fabricating a plurality of circuit elements on a top surface of a semiconductor substrate which has a top surface and a back surface, which oppose each other; a second step of forming a TEOS/CVD silicon oxide film on the top and back surfaces of the semiconductor substrate; and a third step of removing the TEOS/CVD silicon oxide film from the back surface of the semiconductor substrate.

According to another aspect of the present invention, provided is a method of manufacturing a semiconductor integrated circuit device, comprising: a first step of fabricating a plurality of circuit elements on a top surface of a semiconductor substrate which has a top surface and a back surface, which oppose each other; a second step of forming a TEOS/CVD silicon oxide film on the top and back surfaces of the semiconductor substrate; and a third step of making the thickness of the TEOS/CVD silicon oxide film provided on the back surface of the semiconductor substrate fall within a range such that the degree of resultant degassing falls within a tolerance employed in a process of forming an integrated circuit device on the semiconductor substrate.

In another aspect of the present invention, in the above method of manufacturing a semiconductor integrated circuit device, in the third step, the TEOS/CVD silicon oxide film provided on the back surface of the semiconductor substrate is made thin so as to assume a thickness of 200 nanometers or less.

According to another aspect of the present invention, provided is a method of manufacturing a semiconductor integrated circuit device, comprising: a first step of fabricating a plurality of circuit elements on a top surface of a semiconductor substrate which has a top surface and a back surface, which oppose each other; a second step of forming a TEOS/CVD silicon oxide film on the top and back surfaces of the semiconductor substrate; and a third step of newly forming a thin TEOS/CVD silicon oxide film which involves degassing falling within a tolerance employed in a process of forming an integrated circuit device on the semiconductor substrate.

In another aspect of the present invention, in the above method of manufacturing a semiconductor integrated circuit device, in the third step, a TEOS/CVD silicon oxide film to be newly formed on the back surface of the semiconductor substrate is made thin so as to assume a thickness of 200 nanometers or less.

The advantages of the method inventions may be summarized as follows.

Under a method of manufacturing a semiconductor integrated circuit device according to the present invention, a dielectric film, other than a TEOS/CVD silicon oxide film, that does not cause much degassing is formed so as to cover a TEOS/CVD silicon oxide film provided on the back surface of a semiconductor substrate. Alternatively, there is formed an amorphous silicon film or a polysilicon film, thereby preventing occurrence of degassing in the TEOS/CVD silicon dielectric film provided on the back surface. As a result, there can be prevented a drop in the degree of vacuum in manufacturing processes, as well as a drop in the performance and reliability of a semiconductor integrated circuit device.

The method of manufacturing a semiconductor integrated circuit device according to the present invention includes a step of forming a TEOS/CVD silicon oxide film on the top surface of a semiconductor substrate such that the TEOS/CVD silicon oxide film is not formed on the back surface of the semiconductor substrate; or a step of removing the TEOS/CVD silicon oxide film from the back surface. As a result, there can be prevented occurrence of degassing in the TEOS/CVD silicon dielectric film provided on the back surface, a drop in the degree of vacuum in manufacturing processes, and a drop in the performance and reliability of a semiconductor integrated circuit device.

Under the method of manufacturing a semiconductor integrated circuit device according to the present invention, a TEOS/CVD silicon oxide film provided on the back surface of a semiconductor substrate is made thin until the degree of resultant degassing falls within a given tolerance. Alternatively, the TEOS/CVD silicon oxide film is made thin to a thickness of 200 nanometers or less. While process restrictions, which would otherwise be induced by complete removal of a TEOS/CVD silicon oxide film from the back surface, are avoided, the degree of degassing developing in the TEOS/CVD silicon dielectric film provided on the back surface is suppressed so as to fall within a given tolerance.

Thus, there can be prevented a drop in the degree of vacuum in manufacturing processes, as well as a drop in the performance and reliability of a semiconductor integrated circuit device.

Under the method of manufacturing a semiconductor integrated circuit device according to the present invention, a TEOS/CVD silicon oxide film formed on the back surface of the semiconductor substrate simultaneous with formation of the TEOS/CVD silicon oxide film on the top surface of the same is removed once, and a TEOS/CVD silicon oxide film which involves degassing falling within a given tolerance is formed. Alternatively, a TEOS/CVD silicon oxide film having a thickness of 200 nanometers or less is formed. While process restrictions, which would otherwise be induced by complete removal of a TEOS/CVD silicon oxide film from the back surface, are avoided, the degree of degassing developing in the TEOS/CVD silicon dielectric film provided on the back surface is suppressed so as to fall within a given tolerance. Thus, there can be prevented a drop in the degree of vacuum in manufacturing processes, as well as a drop in the performance and reliability of a semiconductor integrated circuit device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-099815, filed on Mar. 30, 2001 including specification, claims, drawings and summary, on which the Convention priority of the present application is based, are incorporated herein by reference in its entirety.

What is claimed is:

1. A semiconductor integrated circuit device comprising:
a bulk semiconductor substrate having a top surface and a back surface, which oppose each other;
a layer having a plurality of circuit elements fabricated on the top surface of the semiconductor substrate;
a first TEOS/CVD silicon oxide film formed over the layer having the plurality of circuit elements;
a second TEOS/CVD silicon oxide film formed on the back surface of the semiconductor substrate; and
a dielectric film, other than a TEOS/CYD silicon oxide film covering, the second TEQS/CVD silicon oxide film, wherein the dielectric film does not degas above a tolerance during subsequent processing in forming the semiconductor integrated circuit device.

2. The semiconductor integrated circuit device according to claim 1, wherein the second TEOS/CVD silicon oxide film is coated with an amorphous silicon film.

3. The semiconductor integrated circuit device according to claim 1, wherein the second TEOS/CYD silicon oxide film is coated with a polysilicon film.

4. The semiconductor integrated circuit device according to claim 1, further comprising an interconnection over the first TEOS/CVD silicon oxide film.

5. The semiconductor integrated circuit device according to claim 4, wherein the dielectric film does not degas above the tolerance during formation of the interconnection.

6. The semiconductor integrated circuit device according to claim 1, further comprising a stacked layer, between the substrate and the second TEQS/CVD silicon oxide film, formed during formation of the layer comprising the plurality of circuit elements.

7. A semiconductor integrated circuit device comprising:
a bulk semiconductor substrate having a top surface and a back surface, which oppose each other,
a layer comprising a plurality of circuit elements fabricated on a top surface of the semiconductor substrate;
a first TEOS/CYD silicon oxide film, having a first thickness, formed on the layer comprising the plurality of circuit elements; and
a second TEOS/CVD silicon oxide film, having a second thickness less than the first thickness, formed on the back surface of the semiconductor substrate, which degasses within a tolerance during subsequent processing in forming the semiconductor integrated circuit device.

8. The semiconductor integrated circuit device according to claim 7, wherein the second TEOS/CVD silicon oxide film has a thickness of 200 nanometers or less.

9. The semiconductor integrated circuit device according to claim 8, wherein the second TEOS/CYD silicon oxide film has a thickness of 50 and to less than 200 nanometers.

10. The semiconductor integrated circuit device according to claim 7, further comprising an interconnection over the first TEQS/CVD silicon oxide film.

11. The semiconductor integrated circuit device according to claim 10, wherein the second TEOSICVD silicon oxide film does not degas above the tolerance during formation of the interconnection.

12. The semiconductor integrated circuit device according to claim 7, further comprising a stacked layer, between the substrate and second TEOS/CVD silicon oxide film, formed during formation of the layer comprising the plurality of circuit elements.

* * * * *